United States Patent
Shimoda et al.

(10) Patent No.: US 6,337,222 B1
(45) Date of Patent: Jan. 8, 2002

(54) METHODS FOR FABRICATING DISTRIBUTED REFLECTION MULTI-LAYER FILM MIRRORS

(75) Inventors: Tatsuya Shimoda, Nagano-ken; Takeo Kaneko, Misato-Mura; Satoru Miyashita, Chino, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/402,986

(22) PCT Filed: Feb. 9, 1999

(86) PCT No.: PCT/JP99/00559

§ 371 Date: Oct. 14, 1999

§ 102(e) Date: Oct. 14, 1999

(87) PCT Pub. No.: WO99/42863

PCT Pub. Date: Aug. 26, 1999

(30) Foreign Application Priority Data

Feb. 18, 1998 (JP) .......................................... 10-036349

(51) Int. Cl.$^7$ .............................................. H01L 21/00
(52) U.S. Cl. ....................................................... 438/29
(58) Field of Search .............................. 438/29, 31, 32, 438/761, 763, 781

(56) References Cited

U.S. PATENT DOCUMENTS

| | | |
|---|---|---|
| 3,914,464 A | 10/1975 | Thomasson et al. |
| 5,595,790 A | 1/1997 | Wei |

FOREIGN PATENT DOCUMENTS

| | | | |
|---|---|---|---|
| EP | 0 294 830 A | | 12/1988 |
| EP | 0 342 271 A | * | 11/1989 |
| EP | 0-342 271 A | | 11/1989 |
| EP | 0 735 401 A | | 10/1996 |
| JP | A-57-161809 | | 10/1982 |
| JP | A-64-19305 | | 1/1989 |
| JP | A-7-7223 | | 1/1995 |
| JP | A-7-202162 | | 8/1995 |
| JP | A-7-287115 | | 10/1995 |
| JP | 08 139414 A | * | 5/1996 |
| JP | A-8-139414 | | 5/1996 |
| JP | A-8-213711 | | 8/1996 |
| JP | A-9-162493 | | 6/1997 |
| JP | A-10-190135 | | 7/1998 |
| JP | A-10-284806 | | 10/1998 |
| JP | WP 99 48338 A | | 9/1999 |

* cited by examiner

Primary Examiner—Keith Christianson
(74) Attorney, Agent, or Firm—Oliff & Berridge PLC

(57) ABSTRACT

In a method for fabricating distributed reflection multi-layered film mirrors consisting of a plurality of laminated thin films having a different refractive index, the thin films are formed using a liquid phase film formation method. The liquid phase film formation method includes a step of applying thin film materials forming the thin films, and a step of drying the applied thin film materials. The liquid phase film formation method utilizes an ink jet method. Thin films can be formed in fine patterns with ease and in a short amount of time. Laminated layers with high reliability can be obtained in very fine patterns. The reflection properties such as film thickness and reflectance of distributed reflection multi-layered film mirrors can be controlled with ease.

17 Claims, 4 Drawing Sheets

METHODS FOR FABRICATING DISTRIBUTED REFLECTION MULTI-LAYER FILM MIRRORS

BACKGROUND OF THE INVENTION

The present invention relates to a method for fabricating multi-layered films used in materials and devices such as semiconductor light emitting devices as exemplified by surface emitting semiconductor lasers, various light receiving devices, and waveguide materials. In particular, the present invention relates to a method for fabricating distributed reflection multi-layered film mirrors (DBR mirrors).

Description of Related Art

A distributed reflection multi-layered film mirror (DBR mirror) consists of laminated layers in which materials having different refractive indices are periodically alternated in thin films. The optical thickness of each thin film is made to be ¼ of the wavelength of the generated light. An example of such a DBR mirror achieves a reflectance of 99% or higher when it is made of 10 to 20 layers (5 to 10 pairs of layers). As an example, a pair of DBR mirrors having such properties are provided to sandwich a thin film active layer in a device such as a surface emitting semiconductor laser.

These DBR mirrors are ordinarily fabricated by forming a plurality of thin films in a continuous manner using methods such as vacuum evaporation, sputtering, thermal CVD, and vapor phase epitaxy, in which the vapor of the materials making up the thin films are condensed/solidified on a substrate (in other words, a vapor phase film growth method).

However, in a vapor phase film growth method, materials making up the thin films may thermally decompose at the evaporation temperature of the thin film materials. Moreover, in cases where thin film materials contain a plurality of atomic elements, it is necessary, for example, to provide an evaporation source for each element in order to grow thin films made of uniform compounds, or compounds without compositional variation along the film thickness direction. This is because the vapor pressure differs for each element. Thus, an apparatus tends to be complicated and large.

Moreover, patterning techniques for DBR mirrors, in particular fine patterning techniques, are important in order to fabricate devices such as various active devices and low-loss optical waveguides. When a vapor phase film growth method is utilized to form desired arrangement patterns of thin films, it is necessary in general to combine and/or repeat basic processes such as thin film formation, photoresist application, photomask alignment, lithographic exposure, photoresist development, etching, cleaning and so forth. This overall process requires many basic processes and becomes very complicated.

Furthermore, when thin films forming a DBR mirror of multiple layers are fabricated, as an example, by a conventional sputtering method, a mechanism becomes necessary which exchanges (switches) targets for each of the multiple layers, thereby making an apparatus complicated. Hence, problems arise in that manufacturing cost is high and the yield is low.

Moreover, it is possible to create differences in the crystal growth rate on certain different areas on a substrate, and to form patterns of thin films. This creates a DBR mirror having different wavelength properties for the different areas on the substrate. However, in this method, it is very difficult to change the crystal growth rate abruptly between fine areas. Hence, it has a limit in providing a DBR mirror having different wavelength properties in different fine pattern areas.

SUMMARY OF THE INVENTION

The object of the present invention is to provide methods for fabricating distributed reflection multi-layered film mirrors, wherein the fabricating methods allow the formation of arrangement patterns of thin films with ease and in a short amount of time, and wherein a set of laminated thin films having fine patterns can be obtained with high reliability by the fabrication methods, and wherein the fabrication methods provide easy control over the film design, such as film thickness and reflection properties such as reflectance.

The present invention provides methods (1) to (15) for fabricating distributed reflection multi-layered film mirrors described below.

(1) A method for fabricating distributed reflection multi-layered film mirrors having a plurality of laminated thin films, each with a different refractive index, wherein the thin films are formed using a liquid phase film formation method.

(2) The method for fabricating distributed reflection multi-layered film mirrors of (1) above, wherein the liquid phase film formation method includes steps of:
applying thin film materials from which the thin films are formed, and
solidifying the thin film materials which are applied.

(3) The method for fabricating distributed reflection multi-layered film mirrors of (2) above, wherein the step of solidifying the thin film materials is performed before different thin film materials are applied on the thin film materials.

(4) The method for fabricating distributed reflection multi-layered film mirrors of (2) above, wherein after a plurality of layers of the thin film materials in their intermediate solid states are laminated, they are solidified.

(5) The methods for fabricating distributed reflection multi-layered film mirrors of one of (2) through (4) above, wherein solidification of the thin film materials is performed using thermal processing.

(6) The method for fabricating distributed reflection multi-layered film mirrors of one of (1) through (5) above, wherein composite materials forming thin films are the dielectric materials.

(7) The method for fabricating distributed reflection multi-layered film mirrors of one of (1) through (6) above, wherein the liquid phase film formation method utilizes an ink jet method.

(8) A method for fabricating distributed reflection multi-layered film mirrors in which at least two distributed reflection multi-layered film mirrors having a plurality of laminated thin films, each with a different refractive index, are arranged on the same surface, wherein the formation of thin films forming each of the distributed reflection multi-layered film mirrors is performed using a liquid phase film formation method having a step of applying thin film materials which form the thin films in patterns, and a step of solidifying the thin film materials.

(9) The method for fabricating distributed reflection multi-layered film mirrors of (8) above, wherein the liquid phase film formation method utilizes an ink jet method.

(10) The method for fabricating distributed reflection multi-layered film mirrors of (8) or (9) above, wherein the application of patterns of the thin film materials is performed so that two or more of the distributed reflection multi-layered film mirrors which are arranged on the same surface are formed in a parallel manner.

(11) The method for fabricating distributed reflection multi-layered film mirrors of one of (8) through (10) above, wherein two or more of the distributed reflection multi-layered film mirrors which are arranged on the same surface have different reflection properties from those of the others.

(12) The method for fabricating distributed reflection multi-layered film mirrors of one of (8) through (1) above, wherein the step of solidifying the thin film materials is performed before different thin film materials are applied on the thin film materials.

(13) The method for fabricating distributed reflection multi-layered film mirrors of one of (8) through (11) above, wherein after a plurality of layers of the thin film in their intermediate solid states are laminated, they are solidified.

(14) The method for fabricating distributed reflection multi-layered film mirrors of one of above (8) through (13) above, wherein solidification of the thin film materials is performed using thermal processing.

(15) The method for fabricating reflection multi-layered film mirrors of one of (8) through (14) above, wherein composite materials forming the the thin films are dielectric materials.

DETAILED DESCRIPTION OF PREFERRED EMBODIMENTS

Figure 1A:
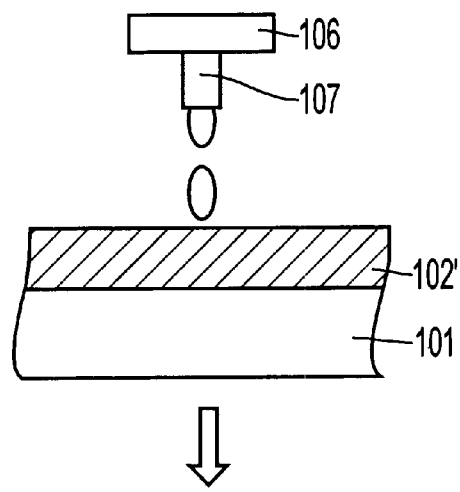
FIGS. 1(A)–(B) are a cross-sectional view illustrating an example of a method for fabricating distributed reflection multi-layered film mirrors of the present invention.
Figure 1B:
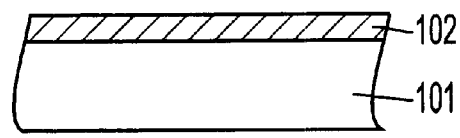

Below, the method for fabricating distributed reflection multi-layered film mirrors is explained in detail.

The present invention discloses a method for fabricating distributed reflection multi-layered film mirrors which consist of laminated thin films of two or more kinds having different refractive indices, wherein the thin films are formed using a liquid phase film formation method.

Here, a "liquid phase film formation method" means that the thin films are dissolved or suspended in solvents to form liquids which are used as thin film materials (application liquids) and the thin films are formed without turning the thin film materials into vapor. On the contrary, a vapor phase film formation method means that thin film materials are heated and evaporated in general under a reduced pressure and the vapor is condensed/solidified on a substrate to form thin films.

In the present invention, thin films are formed by a liquid phase thin film formation method, and hence, there are no issues which a vapor phase thin film formation method would encounter such as thermal decomposition of thin film materials at temperatures of evaporation. Moreover, even when thin film materials contain a plurality of atomic elements, issues such as complication of an apparatus or complicated condition setting requirements would not arise. An apparatus becomes complicated when an evaporation device needs to be facilitated for each atomic element in order to grow uniform compound thin films without compositional variation of the plurality of atomic elements along the film thickness direction.

In the present invention, a liquid phase thin film formation method preferably includes a step of applying thin film materials for formation of the thin films, and a step of solidifying the applied thin film materials. The step of solidifying thin film materials is preferably performed before different thin film materials are applied on the applied thin film materials. This ensures that the thin film materials of each thin film would not be dispersed or mixed between adjacent contacting layers when the different thin film materials are applied to obtain a laminated-layer structure. Thus, uniform thin films without compositional variation can be formed and laminated.

The present invention is not limited to a particular method of solidifying thin film materials. However, it is preferred that it is done using thermal processing. A thermal process evaporates solvents within thin film materials which are used during application at near the normal pressure. Moreover, heating improves the adhesion of thin films.

The thermal processing temperatures for the above solidifying process of thin film materials can be selected for the thin film materials employed. However, temperatures of approximately 300° C. to 1000° C. are preferred. Thermal processing temperatures of this range ensures that thin film materials solidify without thermal decomposition, thus creating thin films with good quality.

Moreover, solidifying thin film materials after the thin film materials in their intermediate solid states are laminated can produce DBR mirrors. "Intermediate solid states" are gel-like states of each of the thin film materials. In such states, each of the thin film materials would not mix with the other of the thin film materials, even if they were laminated one after another. Thus, the film form would not be lost. Further, such states allow formation of thin films through complete solidification. In this case, as in the above method in which thin film materials are solidified before the application of the next layer, different thin film materials can be laminated on one another without dispersion or mixing of the thin film materials between the adjacent contacting layers.

The present invention is not limited to a particular method of preparing thin film materials into intermediate solid states. Examples include a method in which thin film materials are heated at a lower temperature than that in the above conditions for solidification, or for a shorter time period, and a method in which UV and so forth are irradiated on thin film materials. Furthermore, thin film materials may be solidified in two or more different stages of intermediate solid states one by one in order to form thin films.

The present invention is not limited to particular composite materials forming the thin film. Semiconductor materials, dielectric materials and so forth can be used. However, combinations of thin film materials shall be selected so that the refractive index of each of the thin films forming a multi-layered structure satisfies the wavelength properties of desired DBR mirrors. In particular, usage of dielectric materials is preferred. For dielectric materials, organic compounds, which are soluble in organic solvents, can be used as original source materials. Thus, they can be easily applied to a patterning method using an ink jet method, which will be explained later.

Specific examples of dielectric materials include $SiO_2$, $MgO$, $MgF$, $ZnO$, $Al_2O_3$, $TiO_2$, $Ta_2O_5$, $In_2O_3$, $ITO$, $Gd_2O_3$, $La_2O_3$ and so forth.

The present invention is not limited to particular thin film materials, as long as the thin film materials can be made into a liquid form which can be applied on a substrate. Thin film materials can be used in forms such as a solution in an aqueous or organic solvent, a suspension solution, or a sol liquid.

It is also possible to add an auxiliary solvent to a solution of thin film materials in an aqueous or organic solvent. Addition of an auxiliary solvent enables the viscosity, surface tension, vapor pressure and so forth of thin film materials to be adjusted in an arbitrary manner. Thus, an ejection liquid which is suitable for a patterning process using an ink jet method can be prepared.

The present invention is not particularly limited to such an auxiliary solvent. However, as examples, cyclo-hexanone, methoxy-butyl-acetate, ethoxy-ethyl-propionate, Carbitol-acetate, 1,3-dimethyl-2-imidazolidone, butyl-Carbitol-acetate and so forth are preferred. Addition of such solvents enables reduction in damage of ink jet heads, for example, during the application of the materials, as well as adjustments of parameters such as the viscosity of thin film materials. As for the amount of addition of an auxiliary solvent, 5 to 100% in weight with respect to the primary solvent is preferred.

Moreover, in addition to materials forming the thin films, solvents and auxiliary solvents, various other additives and coating stabilizing agents can be added as thin film materials. Examples of such materials to be added include a stabilizing agent, an aging prevention agent, an acidity adjustment agent, a viscosity adjustment agent, a resin emulsion, a leveling agent and so forth.

The present invention is not limited to a particular substrate that is used as a base on which the above thin film materials are applied and DBR mirrors are produced. The shape of a substrate can be flat as used in the embodiments above. In addition, for example, the substrate can be of a prism shape or of a lens surface.

Examples of a liquid phase film formation method which can be used for the method for fabricating DBR mirrors of the present invention include an ink jet method (ink jet technique), a spin coating method, a dipping method, a doctor blade method, FAS coating method, LB method (Langmuir Bodgett method), LPE method (liquid phase epitaxy method) and so forth. Among these, an ink jet method is preferred.

In an ink jet method, thin film materials can be applied in fine droplets (0.5 microns or less) and thereby, patterned application can be performed along fine patterns. Therefore, processes such as mask fabrication and etching which are required in a vapor phase film formation method can be eliminated. Thus, the yield can be improved, manufacturing cost can be reduced and production time can be shortened. Moreover, application materials can be exchanged more easily in an ink jet method than in a vapor phase film formation method. Therefore, a simpler apparatus can be used to form a multiple-thin-layered structure such as a DBR mirror.

Furthermore, in an ink jet method, the film thickness can be easily adjusted by increasing or decreasing the concentration and amount of an ejection solution (thin film materials), and thence, reflection properties such as reflectance of DBR mirrors produced thereby can be easily controlled in an arbitrary manner. Therefore, DBR mirrors can be easily patterned.

Moreover, when at least two distributed reflection multi-layered film mirrors arranged on the same surface are produced in the present invention, the formation of thin films forming each of the distributed reflection multi-layered film mirrors is performed by a liquid phase film formation method having a step of applying in patterns thin film materials which form the thin films, and a step of solidifying the thin film materials. This enables the avoidance of problems with a vapor phase film formation method, as in the above case.

Applying thin film materials in patterns shall be preferably performed by the aforementioned ink jet method. When thin films are formed in an arrangement of fine patterns, this enables steps such as mask fabrication and etching to be eliminated and thereby, patterns of DBR mirrors can be formed with ease and in a short amount of time.

Furthermore, the application of patterns of the thin film materials shall be preferably performed so that two or more of the distributed reflection multi-layered film mirrors which are arranged on the same surface are formed in a parallel manner. Here, "in a parallel manner" means that thin films for different DBR mirrors arranged on a same surface are formed and laminated in parallel, rather than laminating thin films for one DBR mirror by one DBR mirror. For example, the method includes a case in which each thin film is formed in parallel for each of the same DBR mirror and a case in which each thin film is formed in parallel for a different DBR mirror.

When the formation is performed in this manner, proper selection of each of the thin film materials and solidification conditions will allow simultaneous solidification of two or more kinds of thin film materials which are applied in patterns. Thus, the production process is further simplified.

The present invention is not limited to particular application patterns of thin film materials. Examples include methods in which thin film materials are patterned row by row, column by column, and in a checkered manner. When patterns are made in such a manner, thin film materials can be altered for each application procedure. Moreover, the above patterning method can be altered for each step of applying and laminating thin film materials.

It is preferred that two or more of the distributed reflection multi-layered film mirrors which are arranged on the same surface have different reflection properties from those of the others. This enables wavelength properties to be varied on the same surface. For example, if DBR mirrors which are fabricated in this manner are used for an optical resonance cavity, a wide range of optical properties (reflection properties) can be obtained and such a cavity can be employed in various optical devices.

Figure 6:
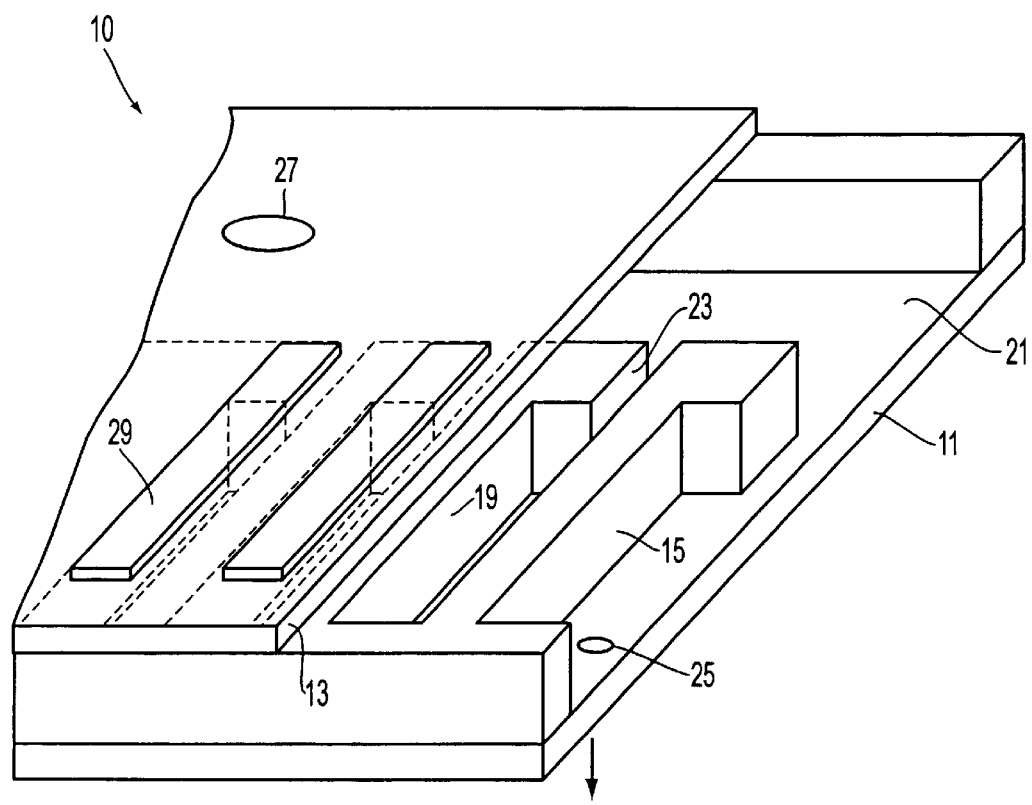
FIG. 6 shows an example of a structure for ink jet heads which is used in a method for fabricating distributed reflection multi-layered film mirrors of the present invention when the structure is viewed from an angle.

FIG. 6 shows the structure of an example of an ink jet head which is utilized in the method for fabricating DBR mirrors in the present invention. This head is equipped with piezoelectric devices.

As an example, the ink jet head 10 is equipped with a stainless steel nozzle plate 11 and a vibration plate 13 which opposes the nozzle plate 11, both of which are connected via a dividing piece (reserver plate) 15.

Between the nozzle plate 11 and the vibration plate 13, a plurality of spaces 19 and a liquid reservoir 21 are formed. Each space 19 and the liquid reservoir 21 are filled with the thin film materials which are employed in the present invention. Each space 19 and the liquid reservoir 21 are connected via supply channels 23.

Furthermore, nozzle holes through which thin film materials in the spaces 19 are ejected in jets are provided on the nozzle plate 11. On the other hand, holes 27 through which thin film materials are supplied to the liquid reservoir 21 are formed on the vibration plate 13.

Moreover, piezoelectric devices 29 are connected to the surface facing the spaces 19 and the opposite surface of the vibration plate 13, where they are placed in corresponding positions to the space 19.

When the piezoelectric devices 29 are turned on, the piezoelectric devices 29 and the vibration plate 13 deform.

The deformations change the volume of each space 19, and the thin film materials are ejected toward a substrate through the nozzle holes 25.

Moreover, inner walls and the peripherals of the nozzle holes 25 may be provided with a water repelling treatment such as Teflon coating in order to prevent the ejection path of thin film materials to be bent or nozzle holes to be clogged.

Using such a head, a certain amount of each of the thin film materials is sequentially ejected in a pattern arrangement and thereafter solidified as an example. These steps are repeated to form a laminated-layer structure to produce DBR mirrors.

In the method for fabricating DBR mirrors of the present invention, materials having the following properties can be used and are suitable thin film materials for an ink jet method.

As for the thin film materials, it is preferred that a contact angle for the material which forms the nozzle surface provided on the ink jet head which jets the composition materials be approximately 30° to 170°. Further, those materials with a contact angle in the range of 35° to 65° are more preferred. Usage of thin film materials having a contact angle of such a range suppresses the ejection path of thin film materials to be bent and enables fine pattern formation.

Here, "the ejection path to be bent" means that the actual arrival point deviates 50 microns or more from the target position when thin film materials are ejected through the nozzles. Bending of an ejection path occurs mainly due to non-uniform wetting of the nozzle holes with thin film materials, clogging of the nozzle holes by solid composite materials in thin film materials and so forth. This can be eliminated by cleaning the heads. The more frequently the bending of an ejection path occurs, the more frequently heads need to be cleaned, and the more degradation in production efficiency occurs for producing DBR mirrors in an ink jet method. By preventing such bending of an ejection path, very fine pattern formation can be performed with higher accuracy and more efficiently.

Moreover, the viscosity of the thin film materials is preferred to be approximately 1 cp to 20 cp, and more preferred to be 2 cp to 4 cp. If the viscosity of the thin film materials is less than 1 cp, the content of the main composite materials which form the thin film becomes too little. Then, there will be a concern that the formation of thin films does not occur sufficiently. On the other hand, if the viscosity of the thin film materials exceeds 20 cp, the thin film materials can not be smoothly ejected through the nozzle holes. Fabricating patterns would be difficult unless specifications of the apparatus are altered by enlarging the nozzle holes. Furthermore, if the viscosity is large, solid composite materials in thin film materials tend to precipitate more easily and nozzle holes would be clogged more frequently.

The surface tension of the thin film materials is preferred to be approximately 20 dyne/cm to 70 dyne/cm, and more preferred to be 25 dyne/cm to 40 dyne/cm. The surface tension in such a range suppresses the extent and frequency of the bending of an ejection path, as is the case with the aforementioned contact angle.

It is preferred that the thin film materials utilized in the method for fabricating DBR mirrors of the present invention satisfy at least one of the value ranges for the above contact angle, viscosity and surface tension. It is more preferred that they satisfy the above conditions for any pair of the properties. It is most preferred that they satisfy the condition for all of the properties.

When an ink jet method forms patterns of DBR mirrors with different wavelength properties, walls (banks) may be formed between the DBR mirrors. Thus, dispersion/mixing of thin film materials during the mirror formation processes and light leakage through gas between mirrors in the final, obtained structure can be prevented. Moreover, adjustments to the size (area) of the segments defined by the walls in which thin films are formed can control the thickness of each of the thin films.

The present invention is not limited to particular materials used to form the walls, as long as such materials can withstand the solvents in the thin film materials and the heat. Examples include organic materials such as acrylic resins, epoxy resins, and photo-sensitive polyimides, and inorganic materials such as liquid glass. Moreover, carbon black may be mixed into the above wall materials, turning them into black resists. Examples of a formation method of such walls include a photolithography technique.

In the above, the ink jet method which utilizes piezoelectric devices was shown as an excellent example of an ink jet method. However, other ink jet methods can be employed.

Below, the following further explains the present invention according to the embodiments.

(Embodiment 1)

In the present embodiment, DBR mirrors were fabricated using the ink jet method illustrated by the approximate cross sections in FIGS. 1(A)–2(B) and employing the materials and conditions shown in Table 1 below.

In these figures, 101 is an Si substrate. First, on this substrate 101, thin film materials 102' shown in Table 1 were ejected from a head 107 of an ink jet printing apparatus 106 and applied in patterns (FIG. 1(A)). The thin film materials 102' were a mixture solution of perhydro-polysilazane ("Polysilazen" manufactured by Tonen Chemical) and solvents.

After the application, the materials were dried in atmosphere at 80° C.

Afterwards, the sample was heated and the temperature was raised to 300° C.–500° C. The sample was annealed for one hour in an electronic furnace and the thin film materials 102' were solidified to form an $SiO_2$ film 102 having a film thickness of 111 nm (FIG. 1(B)).

Figure 2A:
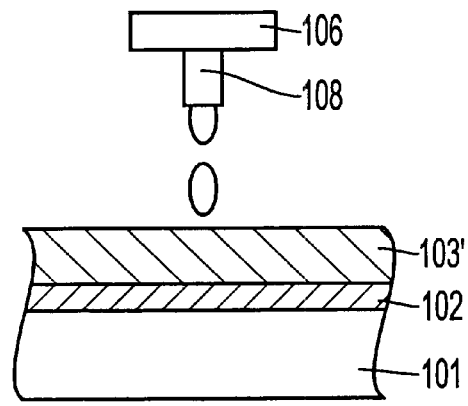
FIGS. 2(A)–(B) are a cross-sectional view illustrating the example of a method for fabricating distributed reflection multi-layered film mirrors of the present invention.
Figure 2B:
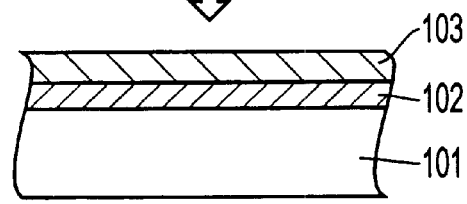

Next, in the same manner as above, thin film materials 103' were applied using the ink jet method (FIG. 2(A)). The thin film materials 103' were an In-Sn organic compound solution ("Adeka ITO Application Solution" manufactured by Asahi Denka Kougyou) as shown in Table 1. After the application, the materials were dried in atmosphere at 80° C. Afterwards, the sample was heated and the temperature was raised to 300° C.–500° C. The sample was annealed for one hour in the electronic furnace and the thin film materials 103' were solidified to form an ITO film 103 having a film thickness of 86 nm (FIG. 2(B)).

The above processes were repeated three times, forming distributed reflection multi-layered film mirrors (oscillation wavelength: 650 nm (red color), reflectance: 78.5%) in which $SiO_2$ films 102 and ITO films 103 were alternatively laminated (cf. Table 1).

TABLE 1

| Composite Materials | Thin film materials (solvent + auxiliary solvent) | Refractive index | Film thickness [nm] | No. of pairs | Solidification conditions | Solidification atmosphere | (DBR mirrors for reflecting red light) Oscillation wavelength [nm] | Reflectance (%) |
|---|---|---|---|---|---|---|---|---|
| SiO$_2$ | perhydro-polysilazane (Xylene + cyclo-hexane) | 1.46 | 111 | 3 | After drying at 80° C., heated to 300–500° C. and annealed for 1 hour in an electronic furnace | Atmosphere | 650 (red) | 78.5 |
| ITO | In—Sn organic compound (Xylene + cyclo-hexane) | 1.9 | 86 | | After drying at 80° C., heated to 300–500° C. and annealed for 1 hour in an electronic furnace | Atmosphere | | |

(Embodiment 2)

In the present embodiment, DBR mirrors were fabricated using the method illustrated by the approximate cross sections in FIGS. 3(A)–(E) and employing the materials and conditions shown in Table 2 below. In this method, each of the thin film materials of Embodiment 1 was used in its intermediate solid state and laminated.

Figure 3A:
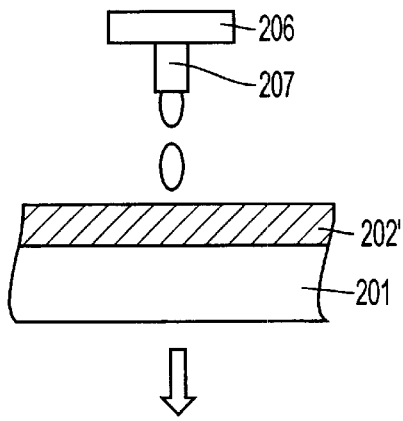
FIG. 3 is a cross-sectional view illustrating another example of a method for fabricating distributed reflection multi-layered film mirrors of the present invention.
Figure 3B:
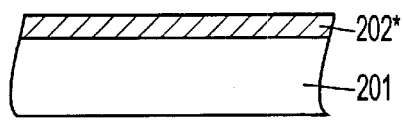

In the same manner as in Embodiment 1, on an Si substrate 201, thin film materials 202' whose composite materials are shown in Table 2 were ejected from a head 207 of an ink jet printing apparatus 206 and applied in patterns (FIG. 3(A)). The thin film materials 202' were a sol solution which was prepared by mixing equal mol amounts of tri-isopropoxy-aluminum and tri-ethanol-amine.

After the application, the materials were dried in atmosphere at 80° C. Afterwards, the sample was heated for 30 minutes at 400° C., and the thin film materials 202' were turned into an intermediate solid state, which formed an intermediate solid state layer 202* (FIG. 3(B)).

Figure 3C:
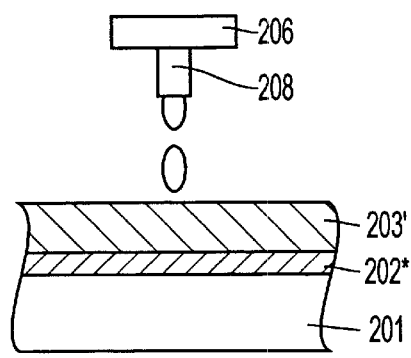
Figure 3D:
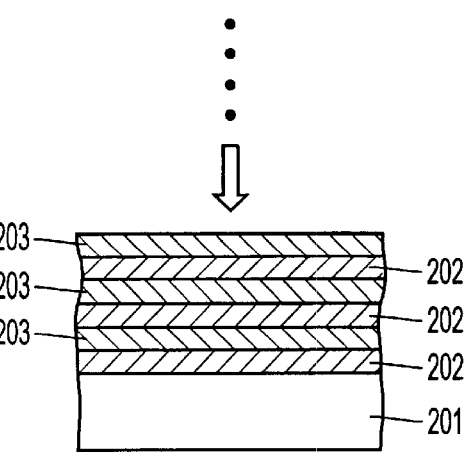
Figure 3E:
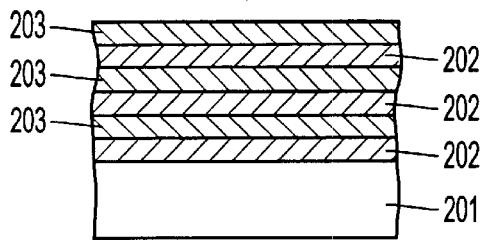

Next, on the intermediate solid state layer 202*, thin film materials 203' were ejected from a head 208 (FIG. 3(C)). The thin film materials 203' were a sol solution shown in Table 2, which was prepared by adding an appropriate amount of acetic acid to zirconium-acetylacetonate and adding solvents. Afterwards, the materials were dried in atmosphere at 80° C. Then, the sample was heated for 30 minutes at 400° C, and the thin film materials 203' were turned into an intermediate solid state, which formed an intermediate solid state layer 203* (FIG. 3(D)).

The above processes were repeated three times and a laminated structure of the intermediate solid-state layers was formed.

Finally, the laminated structure of the intermediate solid-state layers was lamp-annealed in an oxygen environment for 1 to 5 minutes at 700° C and completely solidified. Thus, distributed reflection multi-layered film mirrors (oscillation wavelength: 450 nm (blue color), reflectance: 75.0%) were fabricated in which Al$_2$O$_3$ films 202 with a film thickness of 68 nm and ZrO$_2$ films 203 with a film thickness of 54 nm were alternatively laminated (cf. FIG. 3(E) and Table 2).

TABLE 2

| Composite Materials | Thin film materials (solvent + auxiliary solvent) | Refractive index | Film thickness [nm] | No. of pairs | Condition to form intermediate solid state | Solidification conditions | Solidification atmosphere | (DBR mirrors for reflecting blue light) Oscillation wavelength [nm] | Reflectance (%) |
|---|---|---|---|---|---|---|---|---|---|
| Al$_2$O$_3$ | a mixed solution of equal mol amounts of tri-isopropoxy-aluminum and tri-ethanol-amine (Ethoxy-ethanol + DMI*) | 1.46 | 111 | 3 | After drying in atmosphere at 80° C., heated to 400° C. for 30 minutes | 700° C. × 1 to 5 minutes lamp annealing | Oxygen | 450 (blue) | 78.5 |
| ZrO$_2$ | zirconium-acetylacetonate and acetic acid (an appropriate amount) (Ethoxy-ethanol + DMI*) | 1.9 | 86 | | After drying in atmosphere at 80° C., heated to 400° C. for 30 minutes | 700° C. × 1 to 5 minutes lamp annealing | Oxygen | | |

DMI: 1,3-dimethyl-2-imidazolidone (Embodiment 3)

In the present embodiment, a method illustrated by the approximate cross sections in FIG. 4(A)–(D) was used in which patterns with at least two DBR mirrors were formed on the same surface. The materials and conditions shown in Table 3 were employed. The DBR mirrors having the structure illustrated in FIG. 4(D) and FIG. 5 were fabricated. First, walls (banks) 302 (made from a polyimide resin with 50 micron pitch and 2 micron thickness) were formed on an Si substrate 301 using a photolithography technique (FIG. 4(A)).

Figure 4A:
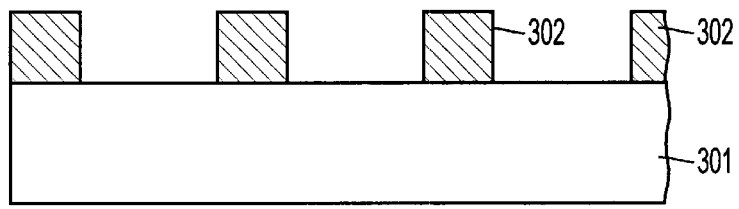
FIGS. 4(A)–(B) are a cross-sectional view illustrating an example of another method for fabricating distributed reflection multi-layered film mirrors of the present invention.
Figure 4B:
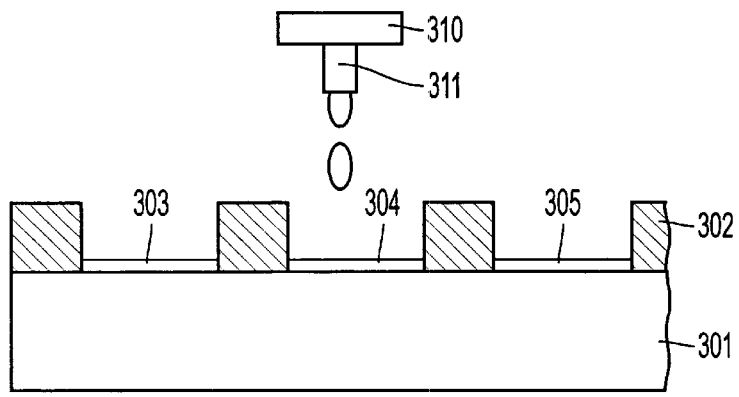
Figure 4C:
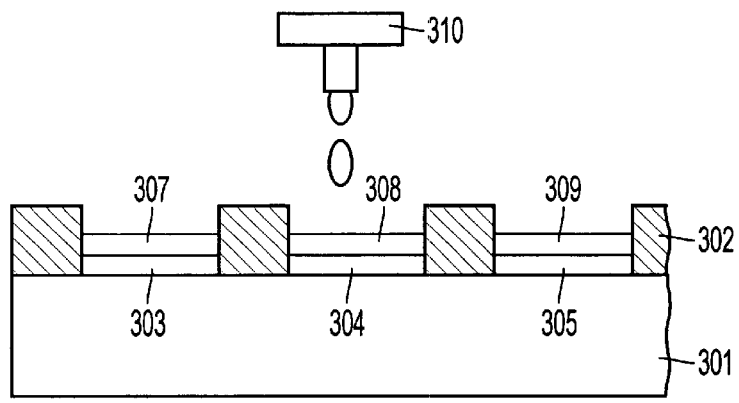
Figure 4D:
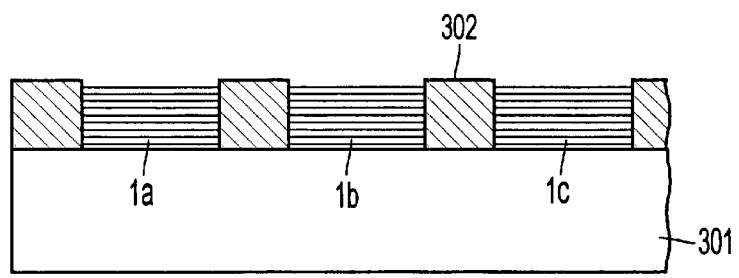

Next, thin film materials for an MgO film 304, which was the first film of final DBR mirrors 1b (FIG. 4(D)), were ejected from a head 311 of an ink jet printing apparatus 310 and applied in patterns. A mixture solution of the thin film materials was prepared by mixing magnesium-methoxide and mono-ethanol-amine of equal mol amounts, as shown in Table 3.

Next, thin film materials, as shown in Table 3, for an SiO$_2$ film 303, which was the first film of final DBR mirrors 1a (FIG. 4(D)) were applied in patterns in the same manner as in Embodiment 1. Thin film materials, as shown in Table 3, for an Al$_2$O$_3$ film 305, which was the first film of final DBR mirrors 1c (FIG. 4(D)) were applied in patterns.

Thus, the thin film materials for the first film of each of the DBR mirrors were applied in patterns. Afterwards, the sample was dried in atmosphere at 80° C. Then, it was baked at 200° C. for 10 minutes. In an oxygen environment, it was heated to 500° C.–700° C. Subsequently, the materials were lamp-annealed for 1 to 5 minutes and were simultaneously solidified. Thus, an $SiO_2$ film 303 (film thickness: 111 nm) of DBR mirrors 1a, an MgO film 304 (film thickness: 76 nm) of DBR mirrors 1b, and an $Al_2O_3$ film 305 (film thickness: 68 nm) of DBR mirrors 1c were formed (FIG. 4(B)).

Next, in the same manner as for the first films, thin film materials for the second films of each kind of DBR mirrors, as shown in Table 3, were applied in patterns, and an ITO film 307 (film thickness: 86 nm) of DBR mirrors 1a, a TiO film 308 (film thickness: 54 nm) of DBR mirrors 1b, and a $ZrO_2$ film 309 (film thickness: 54 nm) of DBR mirrors 1c were formed (FIG. 4(C)).

Figure 5:
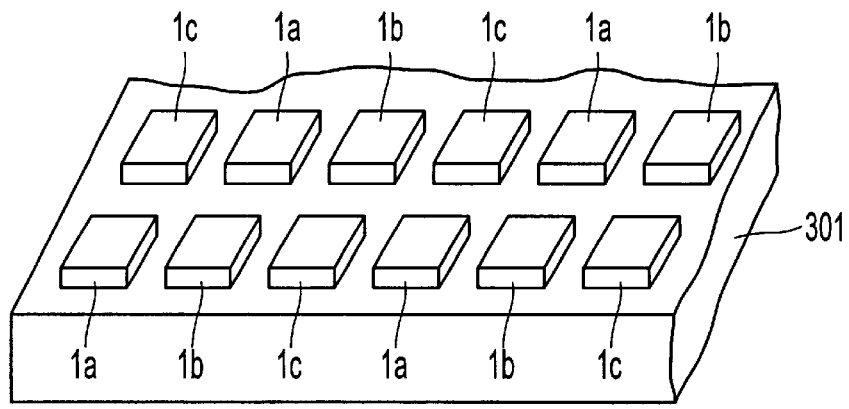
FIG. 5 shows an example of a structure of distributed reflection multi-layered film mirrors fabricating using the fabrication method in FIG. 4 when the structure is viewed from an angle.

The above processes were repeated 5 times for each kind of mirrors and thus, DBR mirrors 1a, 1b, and 1c were formed in a parallel manner on the same substrate, as illustrated in FIGS. 4(D) and 5. The thin film materials and solidification for each kind of DBR mirrors are shown in Table 3 together with the wavelength properties, reflectance and so forth.

temperature of the thin film materials can be controlled with ease. Thus, parameters such as film thickness of the thin films can be arbitrarily designed. Moreover, a simple production apparatus can be used to produce DBR mirrors having various optical (reflection) properties, size and shape at low cost.

In particular, when thin films are formed by an ink jet method, steps such as mask fabrication and etching are not necessary. Hence, DBR mirrors can be produced with ease, in a short time, and with high efficiency. Moreover, adjustment of ejection amounts, concentration and so forth of thin film materials allows for easy adjustment of film thickness, a number of dots, pattern arrangement and so forth. Hence, the reflection properties of DBR mirrors can be arbitrarily designed.

Furthermore, when a plurality of DBR mirrors having different reflection properties are arranged in patterns on the same surface, the mirrors can be formed in a parallel manner. Accordingly, production processes can be further simplified.

Industrial Applicability

As an example, the method for fabricating reflection multi-layered film mirrors of the present invention can be

TABLE 3

| Composite Materials | Thin film materials (solvent + auxiliary solvent) | Refractive index | Film thickness [nm] | No. of pairs | Solidification conditions | Solidification atmosphere | (Full color DBR mirrors) Oscillation wavelength [nm] | Reflectance (%) |
|---|---|---|---|---|---|---|---|---|
| $SiO_2$ | perhydro-polysilazane (Xylene + cyclo-hexane) | 1.46 | 111 | 5 | After drying in atmosphere at 80° C., baked at 200° C. for 10 minutes, heated to 500–700° C. in an oxygen environment and lamp-annealed for 1–5 minutes | Oxygen | 650 (red) | 91.9 |
| ITO | In—Sn organic compound (Xylene + cyclo-hexane) | 1.9 | 86 | | Same as above | Oxygen | | |
| MgO | a mixed solution of equal mol amounts of magnesium-methoxide and mono-ethanol-amine (Ethoxy-ethanol + Carbitol-acetate) | 1.74 | 76 | 5 | Same as above | Oxygen | 530 (green) | 96.2 |
| $TiO_2$ | tetra-isopropoxy-titanium (Ethoxy-ethanol + (Carbitol-acetate) | 2.45 | 54 | | Same as above | Oxygen | | |
| $Al_2O_3$ | a mixed solution of equal mol amounts of tri-isopropoxy-aluminum and tri-ethanol-amine (Ethoxy-ethanol + DMI*) | 1.66 | 68 | 5 | Same as above | Oxygen | 450 (blue) | 89.4 |
| $ZrO_2$ | zirconium-acetylacetonate and acetic acid (as appropriate amount) (Ethoxy-ethanol + DMI*) | 2.1 | 54 | | Same as above | Oxygen | | |

DMI: 1,3-dimethyl-2-imidazolidone

As described above, the method for fabricating distributed reflection multi-layered film mirrors of the present invention is explained herein, based on each of the embodiments which are illustrated by the figures. However, the present invention is not limited to these embodiments. For example, in each of the DBR mirrors on the same substrate as explained in Embodiment 3, the number of films may differ from that of other mirrors.

Moreover, DBR mirrors may have a structure in which three or more different kinds of thin films are periodically laminated.

As explained above, the method for fabrication distributed reflection multi-layered film (DBR) mirrors of the present invention forms thin films by a liquid phase film formation method. Thus, thin film materials (composite materials and solvents) can be chosen with ease and the concentration, viscosity, surface tension, contact angle and utilized for a method in which fine patterns of DBR mirrors having different reflection properties are fabricated on semiconductor laser devices with high accuracy. The rapid changes in wavelength properties are suitable for the method for fabricating semiconductor laser equipment which is stabilized over a wide wavelength range. Furthermore, the present invention can be expected to find a wide range of applications as the method for fabricating distributed reflection multi-layered film mirrors which can be utilized for laser devices in optical fiber communications and optical interconnections.

What is claimed is:

1. A method for fabricating distributed reflection multi-layered film mirrors having a plurality of laminated thin films, each thin film having a different refractive index, the method comprising:

forming said thin films using a liquid phase film formation method, said liquid phase film formation method utilizing an ink jet method.

2. The method for fabricating distributed reflection multi-layered film mirrors of claim 1, said liquid phase film formation method comprising:

applying thin film materials which form said thin films; and solidifying said applied thin film materials.

3. The method for fabricating distributed reflection multi-layered film mirrors of claim 2, said thin film materials being first thin film materials and solidification of said first thin film materials being performed before an application of second thin film materials on said first thin film materials.

4. The method for fabricating distributed reflection multi-layered film mirrors of claim 2, further comprising:

laminating a plurality of layers of said thin film materials in intermediate solid states before solidification.

5. The method for fabricating distributed reflection multi-layered film mirrors of claim 2, solidification of said thin film materials being performed using thermal processing.

6. The method for fabricating distributed reflection multi-layered film mirrors of claim 1, said thin films comprising composite materials of dielectric materials.

7. A method for fabricating distributed reflection multi-layered film mirrors in which at least two distributed reflection multi-layered film mirrors having a plurality of laminated thin films, each with a different refractive index, are arranged on a same surface, formation of thin films comprising each of said distributed reflection multi-layered film mirrors being performed using a liquid phase film formation method that utilizes an ink jet method, the liquid phase film formation method comprising:

applying thin film materials which form said thin films in patterns; and solidifying said thin film materials.

8. The method for fabricating distributed reflection multi-layered film mirrors of claim 7, application of the patterns of said thin film materials being performed so that at least two of said distributed reflection multi-layered film mirrors which are arranged on said same surface are formed in a parallel manner.

9. The method for fabricating distributed reflection multi-layer film mirrors of claim 7, at least two of said distributed reflection multi-layered film mirrors which are arranged on said same surface having different reflection properties from reflection properties of other distributed reflection multi-layered film mirrors.

10. The method for fabricating distributed reflection multi-layered film mirrors of claim 1, said thin film materials being first thin film materials, solidification of said first thin film materials being performed before an application of second thin film materials on said first thin film materials.

11. The method for fabricating distributed reflection multi-layered film mirrors of claim 7, further comprising:

laminating a plurality of layers of said thin film materials in intermediate solid states before solidification.

12. The method for fabricating distributed reflection multi-layered film mirrors of claim 7, solidification of said thin film materials being performed using a thermal processing.

13. The method for fabricating distributed reflection multi-layered film mirrors of claim 7, said thin films comprising composite materials of dielectric materials.

14. A method for fabricating a light emitting device having distributed reflection multi-layered film mirrors having a plurality of laminated thin films, each thin film having a different refractive index, the method comprising:

forming said thin films using a liquid phase film formation method, said liquid phase film formation method utilizing an ink jet method.

15. A method for fabricating a light receiving device having distributed reflection multi-layered film mirrors having a plurality of laminated thin films, each thin film having a different refractive index, the method comprising:

forming said thin films using a liquid phase film formation method, said liquid phase film formation method utilizing an ink jet method.

16. A method for fabricating a light emitting device having distributed reflection multi-layered film mirrors in which at least two distributed reflection multi-layer film mirrors having a plurality of laminated thin films, each with a different refractive index, are arranged on a same surface, formation of thin films comprising each of said distributed reflection multi-layered film mirrors being performed using a liquid phase film formation method that utilizes an ink jet method, the liquid phase film formation method comprising:

applying thin film materials which form said thin films in patterns; and solidifying said thin film materials.

17. A method for fabricating a light receiving device having distributed reflection multi-layered film mirrors in which at least two distributed reflection multi-layer film mirrors having a plurality of laminated thin films, each with a different refractive index, are arranged on a same surface, formation of thin films comprising each of said distributed reflection multi-layered film mirrors being performed using a liquid phase film formation method, that utilizes an ink jet method, the liquid phase film formation method comprising:

applying thin film materials which form said thin films in patterns; and solidifying said thin film materials.

* * * * *